(12) United States Patent
Stamper et al.

(10) Patent No.: US 11,177,158 B2
(45) Date of Patent: Nov. 16, 2021

(54) INTEGRATED CIRCUIT STRUCTURE WITH SEMICONDUCTOR-BASED ISOLATION STRUCTURE AND METHODS TO FORM SAME

(71) Applicant: GLOBALFOUNDRIES U.S. INC., Santa Clara, CA (US)

(72) Inventors: Anthony K. Stamper, Burlington, VT (US); Henry L. Aldridge, Jr., Williston, VT (US); Johnatan A. Kantarovsky, South Burlington, VT (US); Jeonghyun Hwang, Ithaca, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/800,011

(22) Filed: Feb. 25, 2020

(65) Prior Publication Data
US 2021/0265198 A1     Aug. 26, 2021

(51) Int. Cl.
*H01L 21/762* (2006.01)
*H01L 29/06* (2006.01)
*H01L 21/763* (2006.01)

(52) U.S. Cl.
CPC ...... *H01L 21/76224* (2013.01); *H01L 21/763* (2013.01); *H01L 29/0649* (2013.01)

(58) Field of Classification Search
CPC ............. H01L 21/76224; H01L 21/763; H01L 29/0649; H01L 24/76264; H01L 21/76229; H01L 21/84
USPC ........ 257/506, 505; 438/207, 218, 219, 294, 438/427
See application file for complete search history.

(56) References Cited

U.S. PATENT DOCUMENTS

| | | | |
|---|---|---|---|
| 6,010,948 A | 1/2000 | Yu et al. | |
| 6,303,413 B1 | 10/2001 | Kalnitsky et al. | |
| 10,192,779 B1 | 1/2019 | Shank et al. | |
| 2006/0157823 A1* | 7/2006 | Sheridan et al. | ... H01L 29/7378 257/565 |
| 2006/0267134 A1* | 11/2006 | Tilke et al. | ....... H01L 21/11521 257/519 |
| 2020/0295126 A1* | 9/2020 | Agam et al. | ............ H01L 29/04 |

* cited by examiner

*Primary Examiner* — Thinh T Nguyen
(74) *Attorney, Agent, or Firm* — Hoffman Warnick LLC

(57) ABSTRACT

Embodiments of the disclosure provide an integrated circuit (IC) structure, including a semiconductor-based isolation structure on a substrate. A shallow trench isolation (STI) structure may be positioned on the semiconductor-based isolation structure. An active semiconductor region is on the substrate and adjacent each of the semiconductor-based isolation structure and the STI structure. The active semiconductor region includes a doped semiconductor material. At least one device on the active semiconductor region may be horizontally distal to the STI structure.

14 Claims, 11 Drawing Sheets

… (1)

INTEGRATED CIRCUIT STRUCTURE WITH SEMICONDUCTOR-BASED ISOLATION STRUCTURE AND METHODS TO FORM SAME

TECHNICAL FIELD

Embodiments of the disclosure relate generally to integrated circuits (ICs). More specifically, the disclosure relates to IC structures including a semiconductor-based isolation structure, and methods to form such structures.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, field effect transistors (FETs), bipolar junction transistors (BJTs) and capacitors. Circuit chips with hundreds of millions of such devices are common.

In the case of transistors such as FETs and BJTs, deep trench isolation formation is a common technique for electrically isolating multiple transistors from each other. Deep trench isolation formation is distinguishable from shallow trench isolation (STI) formation by forming insulative material beneath the lower surface of a doped well, whereas STI material will not extend vertically into a substrate. Deep trench isolation formation typically involves forming a single trench through doped semiconductor and substrate material, and filling the opening with oxide dielectric material or other conventional insulators. Conventional deep trench isolation processes and structures are limited in their effectiveness. For example, the forming and filling of a continuous trench may introduce significant manufacturing costs and/or additional sources of defects. Additionally, conventional deep trench isolation processes offer limited ability to control the depth of the isolation material within an underlying substrate. Such issues are persistent regardless of whether a deep trench isolation is formed before, during, or after other processes to form STIs.

SUMMARY

Aspects of the disclosure provide an integrated circuit (IC) structure, including: a semiconductor-based isolation structure on a substrate; a shallow trench isolation (STI) structure directly on the semiconductor-based isolation structure; an active semiconductor region on the substrate and adjacent each of the semiconductor-based isolation structure and the STI structure, wherein the active semiconductor region includes a doped semiconductor material; and at least one device on the active semiconductor region and horizontally distal to the STI structure.

Further aspects of the disclosure provide an integrated circuit (IC) structure, including: a first active semiconductor region on a substrate, wherein the first active semiconductor region includes a doped semiconductor material; a device on the first active semiconductor region; a semiconductor-based isolation structure on the substrate and including a first sidewall horizontally adjacent to the first active semiconductor region; a shallow trench isolation (STI) structure directly on the semiconductor-based isolation structure and including a first sidewall horizontally abutting the first active semiconductor region; and a second active semiconductor region on the substrate and horizontally adjacent to a second sidewall of the semiconductor-based isolation structure and a second sidewall of the STI structure, wherein the silicon-based dielectric structure and the STI structure physically and electrically isolate the second active semiconductor region from the first active semiconductor region.

Another aspect of the disclosure provides a method of forming an integrated circuit (IC) structure, the method including: forming a first active semiconductor region and a second active semiconductor region within a semiconductor substrate, wherein a non-active semiconductor region of the semiconductor substrate separates the first active semiconductor region from the second active semiconductor region; forming a semiconductor-based isolation structure within the non-active semiconductor region of the semiconductor substrate, and between the first active semiconductor region and the second active semiconductor region, wherein an upper surface of the semiconductor-based isolation structure is below an upper surface of the first active semiconductor region and the second active semiconductor region; and forming a shallow trench isolation (STI) structure on the semiconductor-based isolation structure between the first active semiconductor region and the second active semiconductor region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
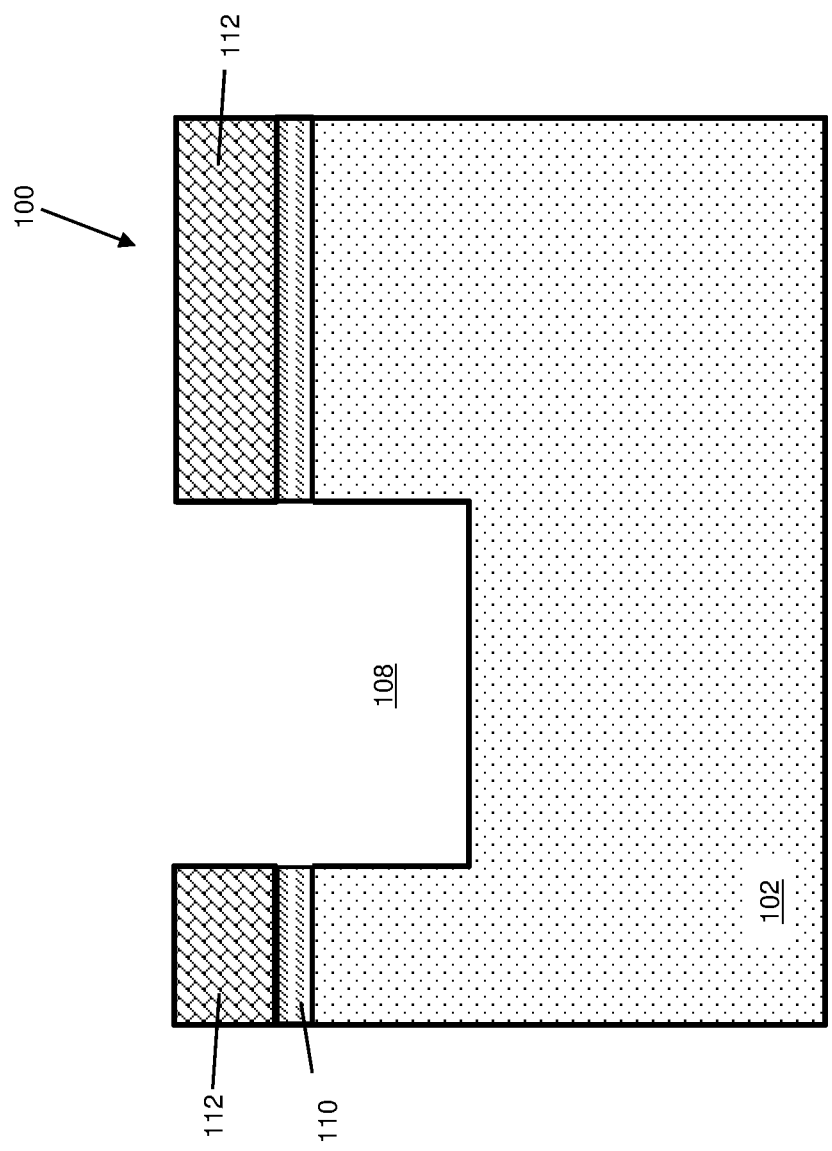
FIG. 1 shows a cross-sectional view of forming a shallow trench according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an integrated circuit (IC) structure with multiple isolation structures, e.g., to provide a cost-effective and reliable deep isolation structures to be used instead of deep trench ("DT") isolation structures. Embodiments of the disclosure may include a semiconductor-based isolation structure on a substrate, which may be formed of polycrystalline silicon. The polycrystalline silicon material of the semiconductor-based isolation structure may be formed by thermal annealing and/or other techniques for converting an initial semiconductor material into a more electrically resistive form of semiconductor material. A dielectric-based isolation structure, e.g., a shallow trench isolation (STI), may be located directly over the semiconductor-based isolation structure, and may be formed of a dielectric material (e.g., one or more oxide compounds) suitable for shallow trench isolation of components. An active semiconductor region including a doped semiconductor material may be adjacent the silicon-based dielectric structure and the STI structure, and at least one device may be on the active semiconductor region and horizontally distal to the STI structure. Embodiments of the disclosure also include methods to form the IC structure including a polycrystalline silicon isolation structure. IC structures according to embodiments of the disclosure may be distinguishable from conventional structures by including multiple isolation structures with different compositions in a deep isolation, with at least one of the multiple isolation structures being polycrystalline silicon on a substrate.

Referring to FIG. 1, embodiments of the disclosure provide methods to form an IC structure. FIG. 1 provides an initial structure 100 (simply "structure" hereafter) capable of being processed to form non-dielectric structures (e.g., high resistivity silicon) and STI structures. Structure 100 may be formed on a substrate 102 including, e.g., one or more semiconductor materials. Substrate 102 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). The entirety of substrate 102 or a portion thereof may be strained.

Substrate 102 may be a high resistivity substrate, i.e., silicon having a resistivity of >100 ohm-cm and, in one embodiment, at least one-thousand ohm-centimeters. In subsequent processing, selected portions of substrate 102 may receive p-type or n-type dopants to become active semiconductor regions by way of any currently known or later developed process to dope a semiconductor material (e.g., surface implantation). P-type dopants refer to elements introduced into semiconductor material to generate free holes by "accepting" electrons from a semiconductor atom and consequently "releasing" the hole. N-type dopants refer to elements introduced into semiconductor material to generate free electrons by "donating" electrons from a semiconductor atom The acceptor atom must have one valence electron less than the host semiconductor. P-type dopants suitable for use in active semiconductor region 104 may include but are not limited to: boron (B), indium (In) and gallium (Ga). Boron (B) is the most common acceptor in silicon technology. Further alternatives include indium and gallium (Ga). Gallium (Ga) features high diffusivity in silicon dioxide ($SiO_2$), and hence, the oxide cannot be used as a mask during Ga diffusion. N-type dopants can include arsenic (As), phosphorus (P), or antimony (Sb).

Structure 100 is shown undergoing a process to remove portions of substrate 102 where shallow trench isolation structures are desired. For instance, as shown in FIG. 1, embodiments of the disclosure may include forming a trench 108 substrate 102 to a predetermined depth. To target and remove portions of substrate 102 within a desired width, embodiments of the disclosure optionally may include forming a dielectric layer 110 on selected portions of active semiconductor region 104. In cases where dielectric layer 110 is used, the composition of dielectric layer 110 may include, e.g., a pad nitride (e.g. $Si_3N_4$), an oxide (e.g. $SiO_2$), and/or other material suitable to protect non-targeted portions of substrate 102 from downward directional etching and/or other processes to form trench 108. In one embodiment, dielectric layer 110 consists of a thermal oxide ($SiO_2$) layer ten nanometers (nm) thick followed by a one-hundred nm nitride layer formed using low pressure chemical vapor deposition. The forming of trench 108 may also include forming a first photoresist layer 112 above substrate 102, optionally contacting an upper surface of dielectric layer 110. With first photoresist layer 112 lithographically patterned, dielectric layer 110 may etched using plasma or wet etches as known in the art, Substrate 102 beneath any previously-removed portions of dielectric layer 110 then may be etched to form trench 108, e.g., also using plasma or wet etches as known the art.

Etching generally refers to the removal of material from a substrate, e.g., substrate 102, or structures formed on the substrate. Etching is often performed with a mask (e.g., first photoresist layer 112) in place so that material may selectively be removed from certain areas of the substrate, while leaving the material unaffected, in other areas of the substrate. There are generally two categories of etching, (i) wet etch and (ii) dry etch. Wet etch is performed with an aqueous etchant (such as an acid or base) which may be chosen for its ability to selectively etch a given material (such as oxide, nitride, or silicon), while, leaving another material (such as photoresist) relatively intact. This ability to selectively etch given materials is fundamental to many semiconductor fabrication processes. As known in the art, a wet etch will generally etch a homogeneous material (e.g., oxide) isotropically, but a wet etch may also etch single-crystal materials (e.g. silicon wafers) anisotropically. As known in the art, dry etch may be performed using a plasma. After trench 108 is formed, first photoresist layer 112 may be removed by way of ashing or any other photoresist strip method known in the art.

Figure 2:
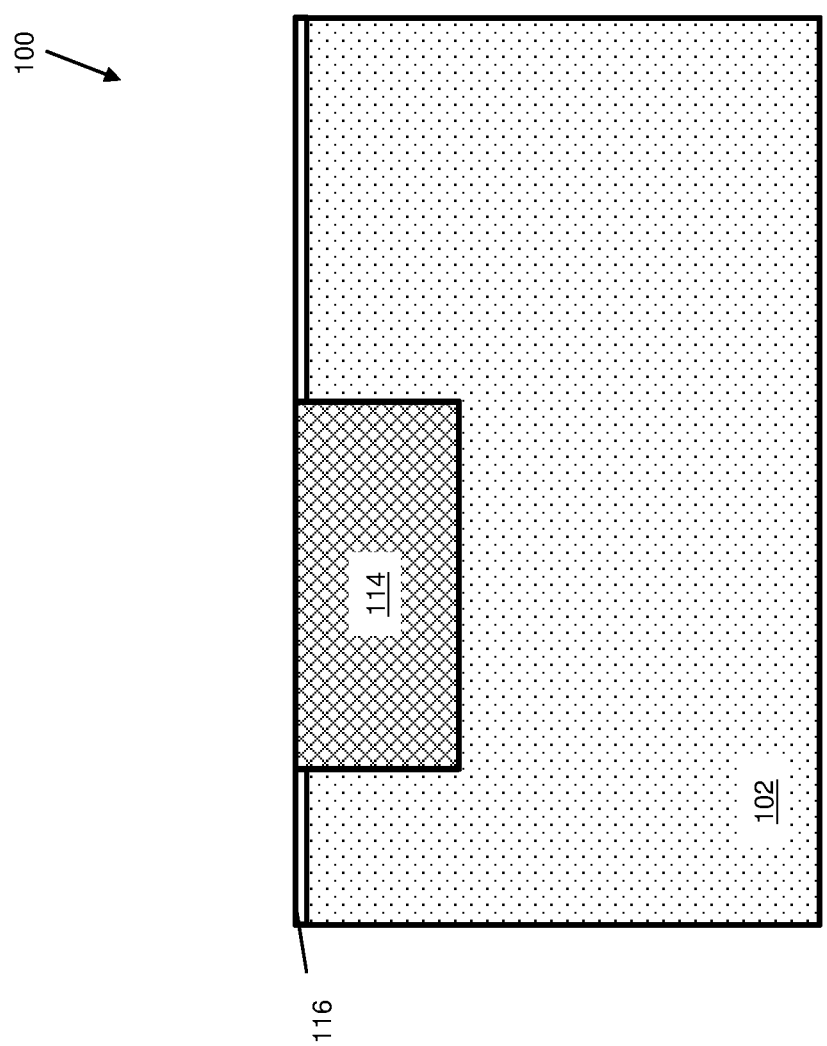
FIG. 2 shows a cross-sectional view of filling the trench with a dielectric isolation material according to embodiments of the disclosure.

Referring briefly to FIG. 2, trench 108 (FIG. 1) may be filled with an insulator (e.g., an oxide such as SiO2) and planarized to form a dielectric-based isolation structure in the form of a shallow trench isolation ("STI") 114. Any known method, such as depositing a dielectric insulator (e.g., oxide) and polishing the deposited dielectric material selective to other insulator materials. The upper nitride layer in pad films 110 (FIG. 1) would be removed during the polish process, as known in the art, leaving an oxide layer 116 (FIG. 2). Thus, oxide layer 116 may include a film of one or more oxide materials on substrate 102 and laterally adjacent STI 114.

Figure 3:
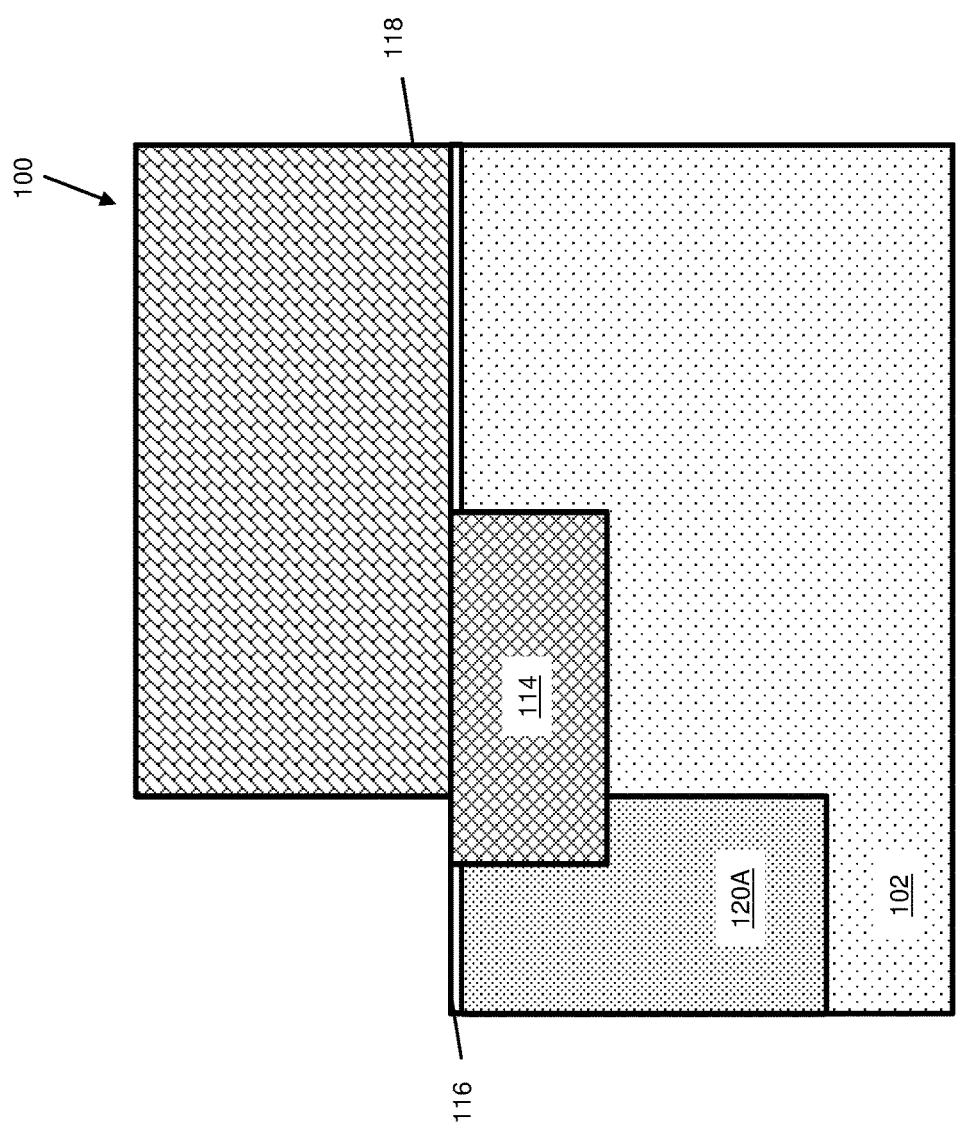
FIG. 3 shows a cross-sectional view of forming a first active semiconductor region according to embodiments of the disclosure.

Referring to FIG. 3 embodiments of the disclosure may include introducing dopants into substrate 102 at selective locations as discussed previously herein. FIG. 3 depicts forming a second photoresist layer 118 on selected portions of substrate 102 STI 114. Second photoresist layer 118 may be shaped such that a portion oxide layer 116, and an underlying portion of substrate 102 targeted for a particular doping type and/or concentration, remain uncovered by second photoresist layer 118. With STI structure 114, oxide layer 116, and second photoresist layer 118 remaining in place, substrate 102 may be doped (e.g., by being vertically implanted with dopant ions) to form a first active semiconductor region 120A within substrate 102. The dopants used to form first active semiconductor region 120A may substantially reduce the resistivity of semiconductor material(s) where dopants are introduced. Portions of substrate 102 beneath STI 114 and second photoresist layer 118 may remain undoped, and hence may substantially retain their original n-type or p-type doping as determined by the substrate 102. After first active semiconductor layer 120A is formed, second photoresist layer 118 may be removed by way of ashing or any other photoresist strip method known in the art.

Figure 4:
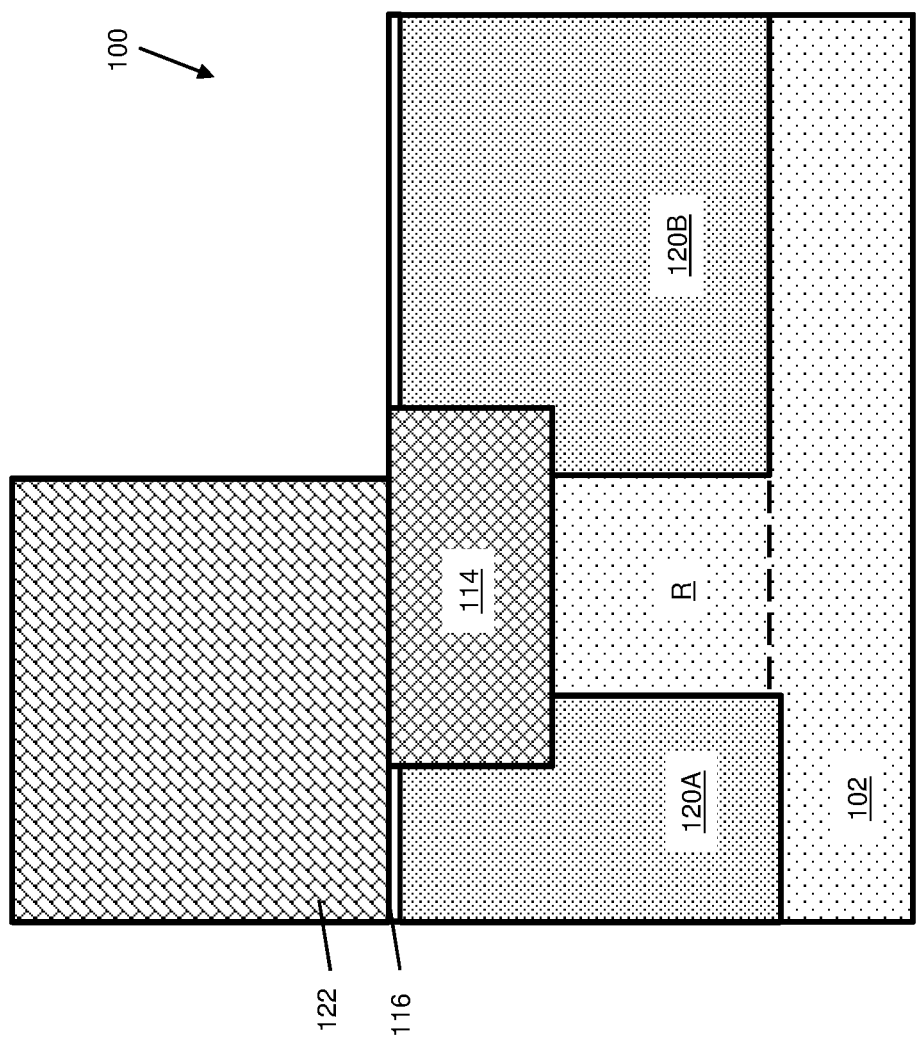
FIG. 4 shows a cross-sectional view of forming a second active semiconductor region according to embodiments of the disclosure.

FIG. 4 depicts an additional process to form a third photoresist layer 122 on STI 114 and the previously-formed first active semiconductor region 120A, and additional dopant material is introduced to another portion of substrate 102 to form a second active semiconductor region 120B. As with other doping processes noted herein, oxide layer 116 may remain intact over substrate 102 as substrate 102 is doped to form second active semiconductor region 120B. The dopants used to form second active semiconductor region 120B may be the same as, or different from, those used to form first active semiconductor region 120A. The dopants used to form active semiconductor regions 120A and 120B may be implanted to the same depth (e.g., as shown in FIG. 4) or to different depths. At least a portion of substrate 102 beneath STI 114, and horizontally between active semiconductor regions 120A, 120B may remain free of dopants or otherwise may feature a doping level that is low enough to retain a high resistivity (e.g., at least 100 ohm-cm and, in one embodiment, one-thousand ohm-centimeter as discussed elsewhere herein). The remaining non-doped portion(s) of substrate 102 beneath STI 114 may be separately identified as a non-active semiconductor region R. After second active semiconductor layer 120B is formed, third photoresist layer 122 may be removed by way of ashing or any other photoresist strip method known in the art.

Figure 5:
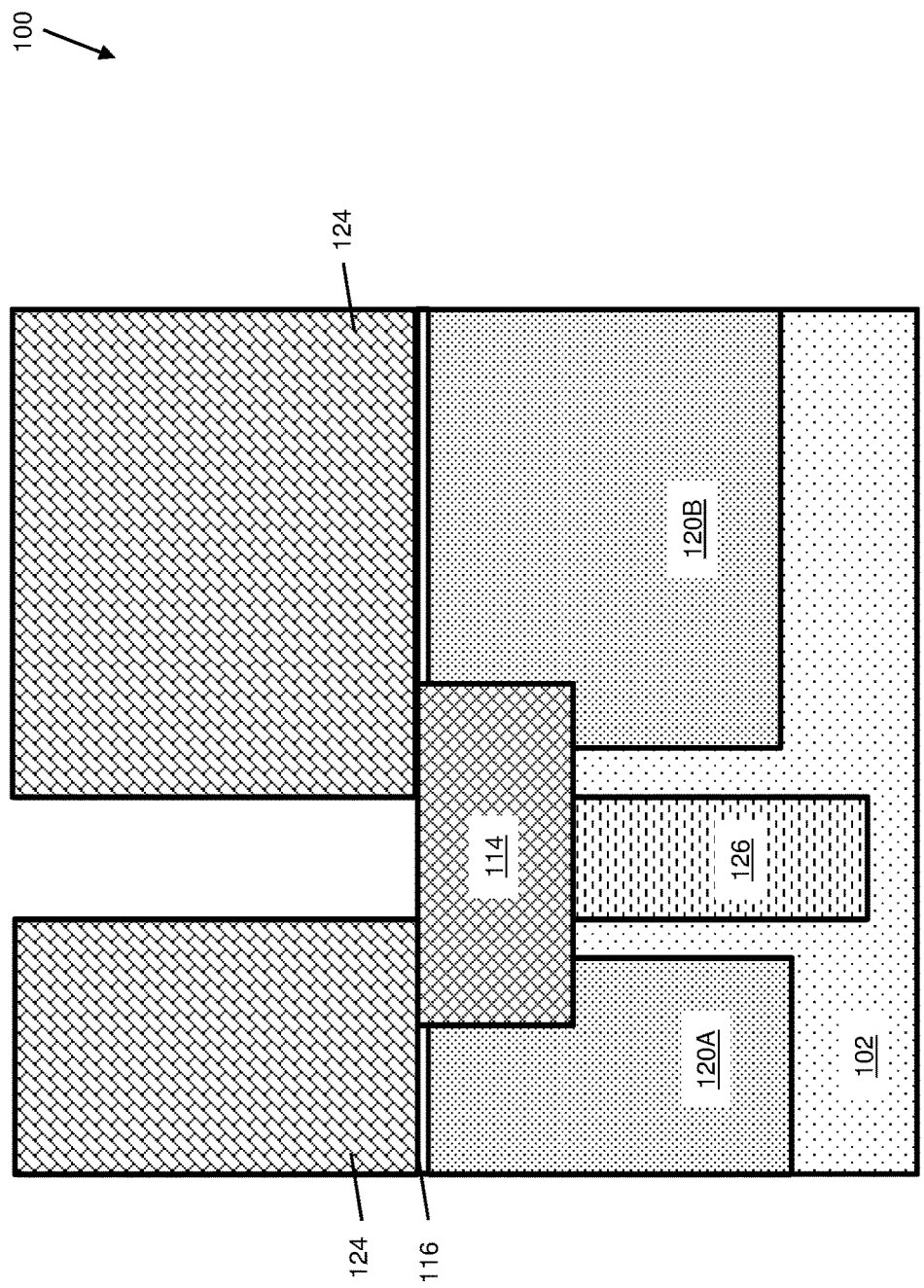
FIG. 5 shows a cross-sectional view of forming a precursor isolation structure below the dielectric isolation structure according to embodiments of the disclosure.

Referring now to FIG. 5, embodiments of the disclosure may include forming a fourth photoresist layer 124 structured to cover the previously-formed active semiconductor regions 120A, 120B and, optionally, portions of STI structure 114. With fourth photoresist layer 124 in place, remaining high resistivity portions of substrate 102 beneath dielectric-based insulator structure 114 may be converted into a semiconductor-based isolation structure according to various additional processes. An initial process to form a semiconductor-based isolation material may include selectively changing the semiconductor composition of substrate 102 beneath dielectric-based insulator structure 114, e.g., by converting targeted portions of high-resistivity silicon into amorphous silicon, and thereafter converting the amorphous silicon into polycrystalline silicon. According to an example, such processes may be implemented after dielectric-based insulator structure 114. To effect transition of substrate 102 into isolation material beneath STI 114, embodiments of the disclosure may include implanting inert elements such as argon (Ar) ions into substrate 102 to convert the implanted material into amorphous silicon ($\alpha$-Si). The argon implantation may occur, e.g., with a dosage of at least approximately $1.0 \times 10^{14}$ atoms and an implantation energy of, e.g., at least approximately 1.0 mega electron-volts (MeV) or more specifically up to approximately 2.0 MeV. The implanting of Ar ions may form an amorphous silicon region 126 within substrate 102 beneath STI 114. The dosage and implantation energy may control the height of amorphous silicon region 126. For example, if a maximum implant energy of 2 MeV is used at an argon dose of 1.25E15 ions per cm$^2$, then the argon implant depth will be approximately 2 microns. In alternative embodiments, multiple argon implant energies could be used, for example 0.25, 0.5, 0.75, 1.00, 1.25, 1.50, 1.75, and 2.00 MeV could be used with an argon dose of 0.15625E15 for each ion implant energy employed. In alternate embodiments, other noble gases such as xenon, etc. can be used in place of argon; oxygen can be used in place of argon; or a semiconductor such as germanium or silicon may be used in place of argon. In various examples, the combined height of STI 114 and amorphous silicon region 126 may be between approximately 1.0 micrometers and approximately 2.5 micrometers when the ion implantation concludes. Although amorphous silicon region 126 is shown by example to be horizontally displaced from active semiconductor regions 120A, 120B, amorphous silicon region 126 may laterally abut and contact active semiconductor regions 120A, 12B in further examples. Following the argon or other species ion implantation, the resist 124 is removed by ashing.

Figure 6:
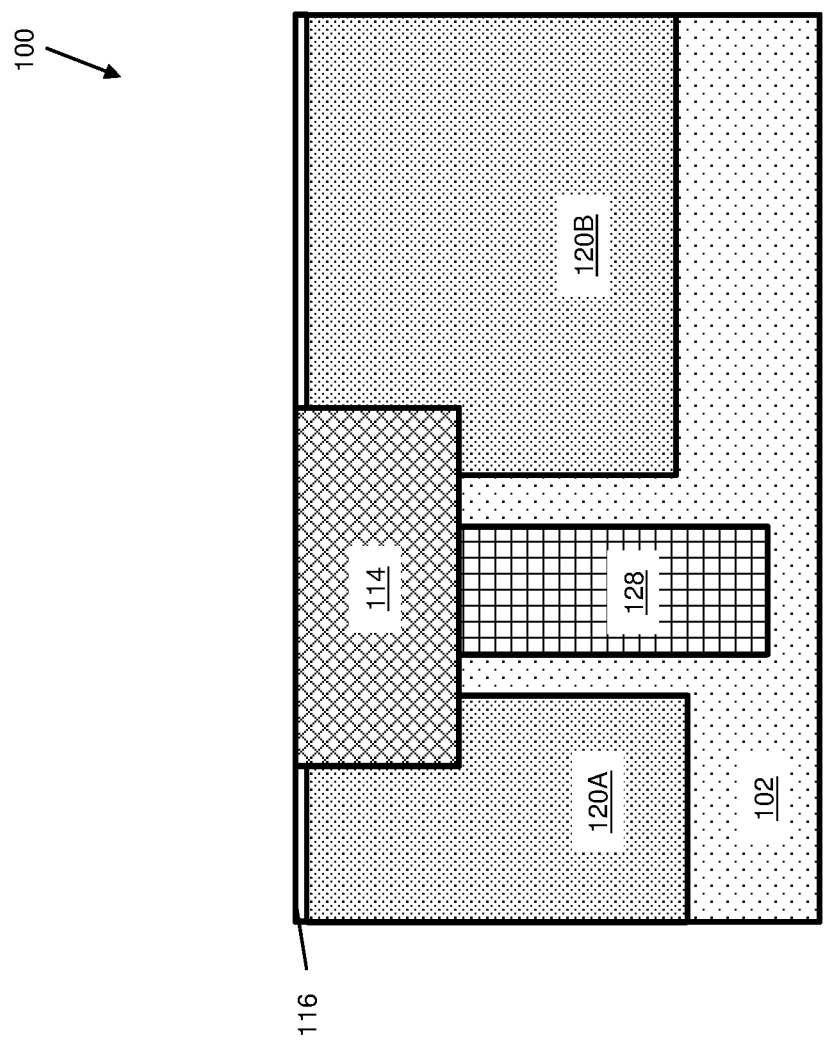
FIG. 6 shows a cross-sectional view of forming a semiconductor-based isolation structure according to embodiments of the disclosure.

Turning to FIG. 6, embodiments of the disclosure may include processes to convert amorphous silicon region 126 (FIG. 5) into a semiconductor-based isolation structure 128. To convert amorphous silicon region 126 (FIG. 5) into polycrystalline silicon and thereby form semiconductor-based isolation structure 128, an annealing process is employed. In embodiments, the anneal temperature is between 900 C and 1100 C. In embodiments, a rapid thermal anneal (RTA) is employed. Annealing is a process in which substrate 102 and materials thereon are heat treated to modify selected properties of any heated materials and structures. Annealing may be particularly suited to embodiments of the disclosure because materials beneath other layers (e.g., amorphous silicon region 126 (FIG. 5) beneath STI structure 114) will be heated as the structure is annealed. After the annealing of amorphous silicon region 126 (FIG. 5) concludes, semiconductor-based isolation structure 128 is converted to polycrystalline silicon.

One process effective for converting amorphous silicon region 126 (FIG. 5) into polycrystalline silicon to form semiconductor-based isolation structure 128 is rapid thermal annealing (RTA). RTA is an annealing process carried out for a very short time, and is conventionally to improve the mechanical properties of selected materials. In embodiments of the disclosure, however, RTA is effective for converting amorphous silicon region 126 into polycrystalline silicon. At the same doping level, polycrystalline silicon has much higher resistivity than crystalline silicon, e.g., as a result of the various processes described herein, and thus suitable for use as a semiconductor-based isolation structure 128 below dielectric-based isolation STI structure 114. Another advantage of using RTA to form semiconductor-based isolation structure 128 is that all other components subjected to annealing, e.g., substrate 102, active semiconductor regions 120A, 120B, STI 114, etc., remain substantially unchanged after the annealing concludes. The use of RTA or other annealing processes allow semiconductor-based isolation structure 128 to be formed after STI 114, even in cases where precursor materials for semiconductor-based isolation structure 128 are formed before STI 114.

Figure 7:
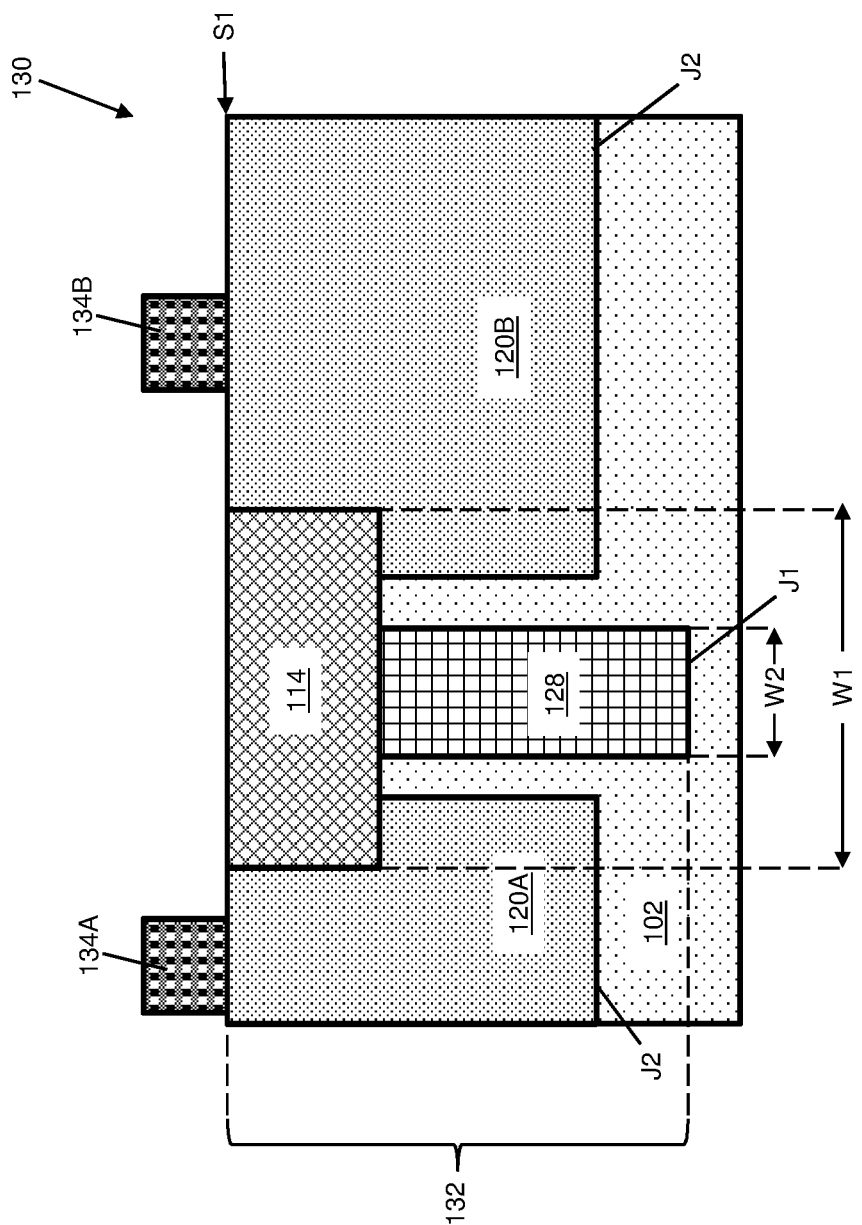
FIG. 7 shows a cross-sectional view of forming devices on the active semiconductor regions according to embodiments of the disclosure.

Referring now to FIG. 7, continued processing according to the disclosure may include, e.g., forming an IC structure 130 that includes dielectric-based STI structure 114 and semiconductor-based isolation structure 128 on substrate 102 to collectively provide a deep isolation 132, i.e., an isolation structure that is deeper than isolation materials formed using only the STI structure 114. As a contrast to conventional deep trench structures, deep isolation 132 includes semiconductor-based isolation structure 128 formed of a high resistivity material, e.g., polycrystalline silicon, to electrically isolate two active semiconductor regions 120A, 120B from each other. In addition to deep isolation 132, methods to form IC structure 130 may include forming at least one device 134, such as a field effect transistor (FET) or NPN transistor on active semiconductor region(s) 120A, 120B as known in the art. As discussed herein, device(s) 134A, 134B may take the form of a transistor or other active element to be isolated from other devices and/or elements located elsewhere within IC structure 130. In addition to device(s) 134A, 134B, several inter-level dielectric (ILD) layers and/or overlying metal wires may also be formed on IC structure 130 via back end of line (BEOL) processing. Such layers and elements are omitted from FIG. 7 solely for ease of illustration.

Semiconductor-based isolation structure 128 of IC structure 130 may include polycrystalline silicon therein. IC structure 130 may also include dielectric-based STI structure 114, e.g., an STI material, directly on semiconductor-based isolation structure 128, and with a dielectric material composition that can be free or substantially free of any polycrystalline silicon material. In this arrangement, deep isolation 132 may extend continuously from the upper surface (Si) of active semiconductor region(s) 120A, 120B to a depth J1 past the bottom surface J2 of active semiconductor region(s) 120A, 120B, thereby retarding or preventing electrical pathways from forming across portions of substrate 102 beneath isolation structure 132. In further embodiments, deep isolation 132 may span approximately 1.0 to 2.5 micrometers (μm). The location and composition of deep isolation 132 and its subcomponents may arise from, e.g., performing one or more methods according to the disclosure to form IC structure 130.

The structure and properties of deep isolation 132, including semiconductor-based isolation structure 128, can electrically separate first active semiconductor region 120A and device(s) 134A, 134B thereon from second active semiconductor region 120B and any other devices 134A thereon. By forming semiconductor-based isolation structure 128 in portions of substrate 102 beneath dielectric-based STI structure 102, a bottom surface J1 of semiconductor-based isolation structure 128 may be located below a bottom surface J2 of active semiconductor region(s) 120A, 120B. These attributes of deep isolation 132 may allow deep isolation 132 to have a greater vertical span than conventional STI structures 114 which lack semiconductor-based isolation structure 128. Dielectric-based STI structure 114 may also feature first horizontal width W1 greater than second horizontal width W2 of semiconductor-based isolation structure 128, e.g., as a result of implementing one or more methods to form deep isolation 132 according to embodiments of the disclosure.

According to an example, device(s) 134A, 134B may take the form of a bipolar junction transistor (BJT), a metal oxide semiconductor (MOS) field effect transistor (MOSFET), a lightly doped drain MOS (LDMOS), a diode, a capacitor, or any active or passive device as known in the art. Device(s) 134A, 134B in further embodiments may include, e.g., one or more capacitors, resistors, inductors, diodes, etc., for implementing various electrical functions. In any case, device(s) 134A, 134B may include doped semiconductor materials similar to, or different from, the material composition of active semiconductor region(s) 120A, 120B. According to an example, one or more of device(s) 134A, 134B may include a silicon germanium (SiGe) layer deposited onto active semiconductor region(s) 120A, 120B, and/or formed by converting semiconductor material of active semiconductor region(s) 120A, 120B into SiGe. In some cases, portions of active semiconductor region(s) 120A, 120B may operate as a sub-collector region of device 134A, 134B, and thus may be considered to be a portion of device 134. In still further examples, portions of active semiconductor region(s) 120A, 120B may replace or operate as portions of device 134A, 134B, e.g., in the form of transistor terminals thereof. In any case, device 134A, 134B may be horizontally distal to dielectric-based STI structure 114 of deep isolation 132. As used herein, the term "horizontally distal" refers to one element being horizontally displaced from another, and separated from the other element by at least one other intervening element. In this case, devices 134A, 134B may be horizontally distal to STI 114 because portions of active semiconductor region 120A, 120B horizontally separate devices 134A, 134B and dielectric-based STI structure 114 from each other. Devices 134A, 134B may also be vertically above portions of semiconductor-based isolation structure 128 in IC structure 130 in further examples.

Figure 8:
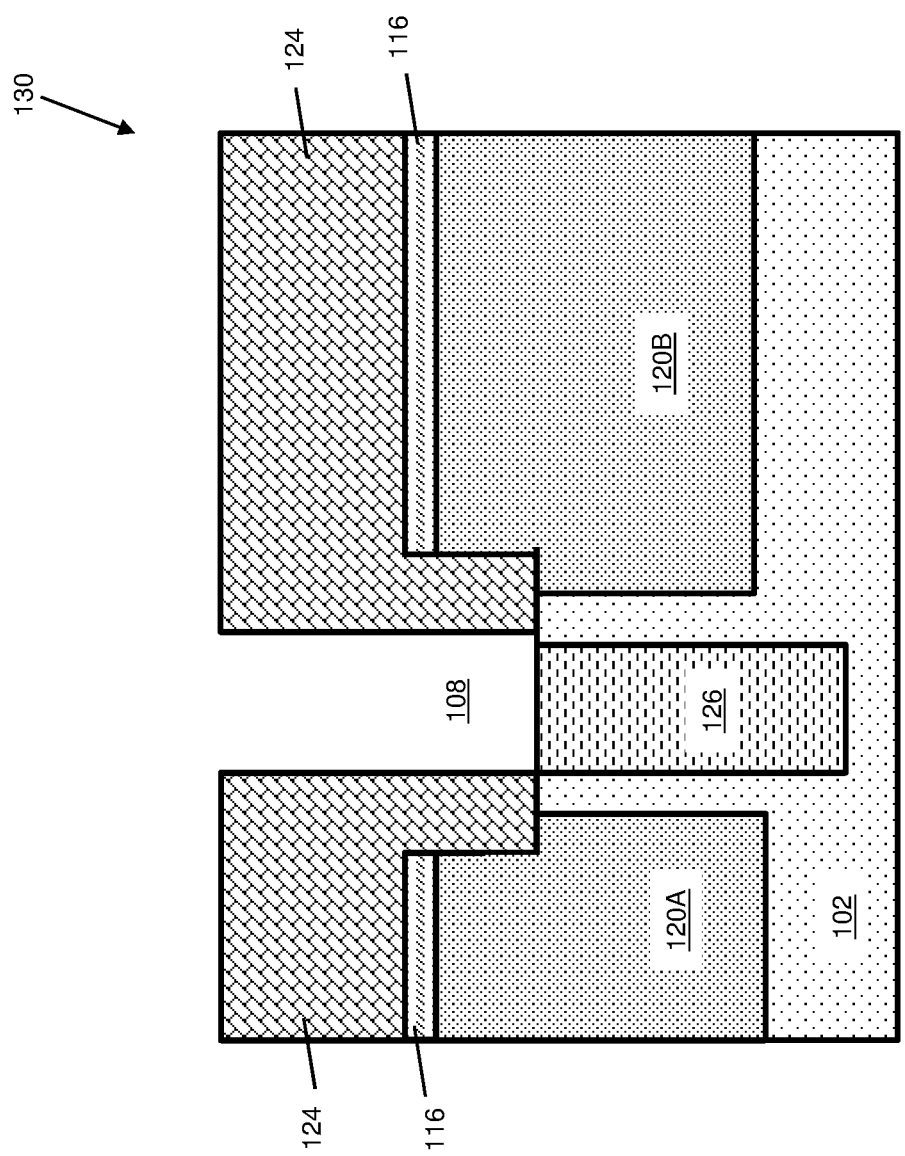
FIG. 8 shows a cross-sectional view of targeting a portion of a substrate for isolation structure formation according to further embodiments of the disclosure.
Figure 9:
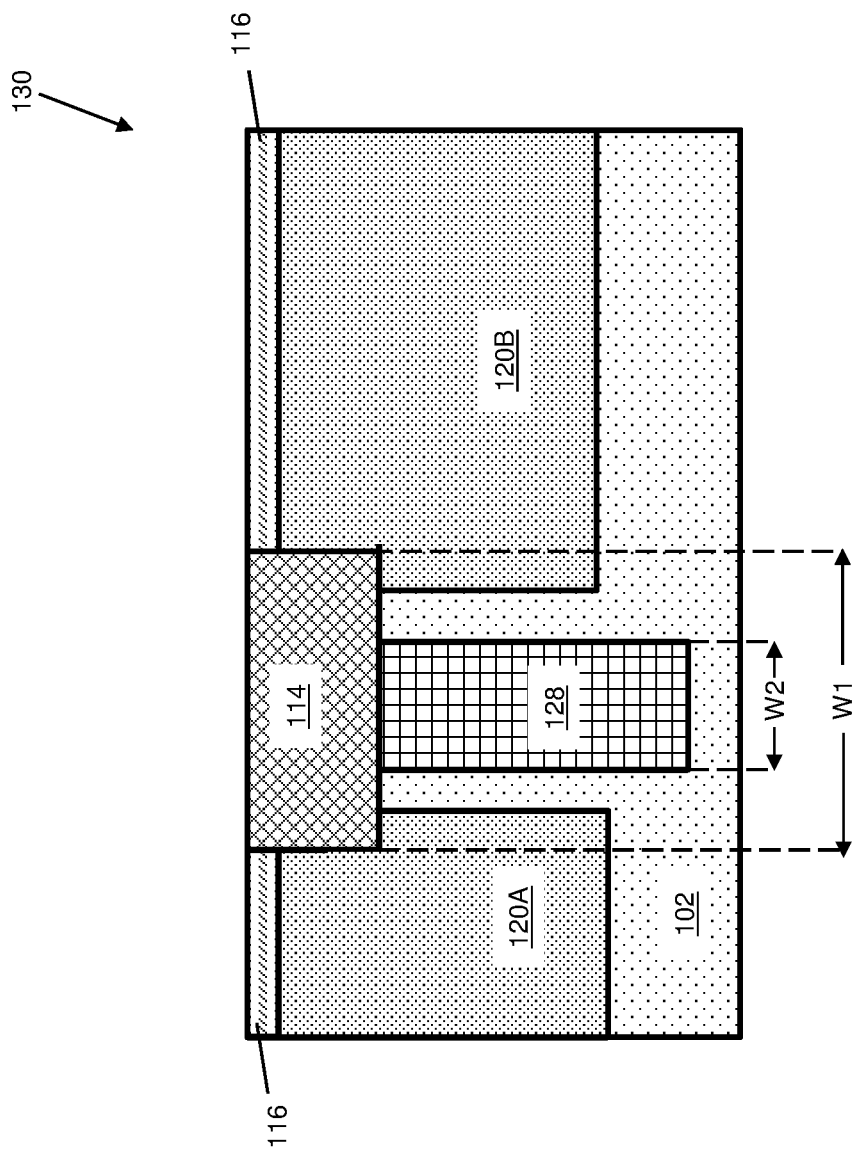
FIG. 9 shows a cross-sectional view of isolation structure formation in the targeted region according to embodiments of the disclosure.

Referring to FIGS. 8 and 9 together, further embodiments of the disclosure may include forming amorphous silicon region 126 (FIG. 8) before STI structure 114 is fully formed, completing the formation of STI region 114 (i.e. filling it with oxide and polishing the oxide), and converting region 126 into semiconductor-based isolation structure 128 (FIG. 9) after dielectric-based isolation STI structure 114 (FIG. 13) is fully formed. Although various processes according to the disclosure may form IC structure 130 (FIG. 7) by undertaking various steps in a different order, it is understood that the embodiments IC structure 130 may be structurally and operationally similar or identical regardless of the particular operational methodology used to form IC structure 130. FIG. 8 depicts active semiconductor regions 120A, 120B horizontally separated by a high resistivity region of substrate 102. Trench 108 and active semiconductor regions 120A, 120B may be formed substantially by the processes shown in FIGS. 3 and 4 and discussed elsewhere herein, and/or by any conceivable method to form doped semiconductor regions within a substrate. Before trench 108 is filled with dielectric material, fourth photoresist layer 124 (FIG. 8) is be formed above substrate 102 and active semiconductor regions 120A, 120B on oxide layer 116 and within portions of trench 106.

Figure 10:
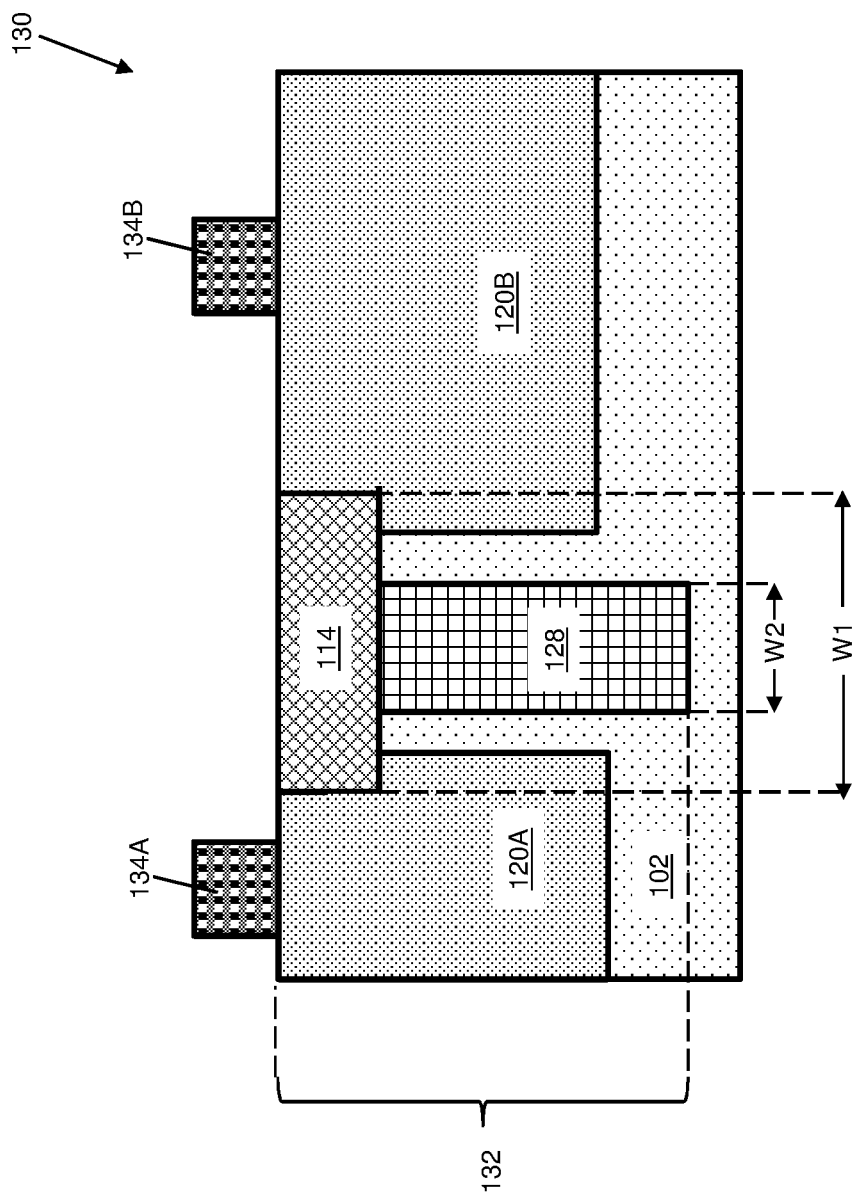
FIG. 10 shows a cross-sectional view of an integrated circuit (IC) structure according to embodiments of the disclosure.

At least a portion of high resistivity region R of substrate 102 may not be covered by fourth photoresist layer 124. Argon atoms may be introduced (e.g., by implantation) into substrate 102 to form amorphous silicon region 126 within substrate 102. The argon atoms may be implanted by any suitable combination of dosage and implantation energy, e.g., those discussed elsewhere herein; and other elements such as noble gases, oxygen, silicon, or germanium may be implanted instead or in addition to argon. FIG. 10 depicts the formation of STI structure 114 including filling it with oxide and polishing followed by the conversion of amorphous silicon region 126 into semiconductor-based isolation structure 128 with an anneal similar to the one used in FIG. 6, e.g., polycrystalline silicon, which may be implemented by annealing as discussed elsewhere above.

Figure 11:
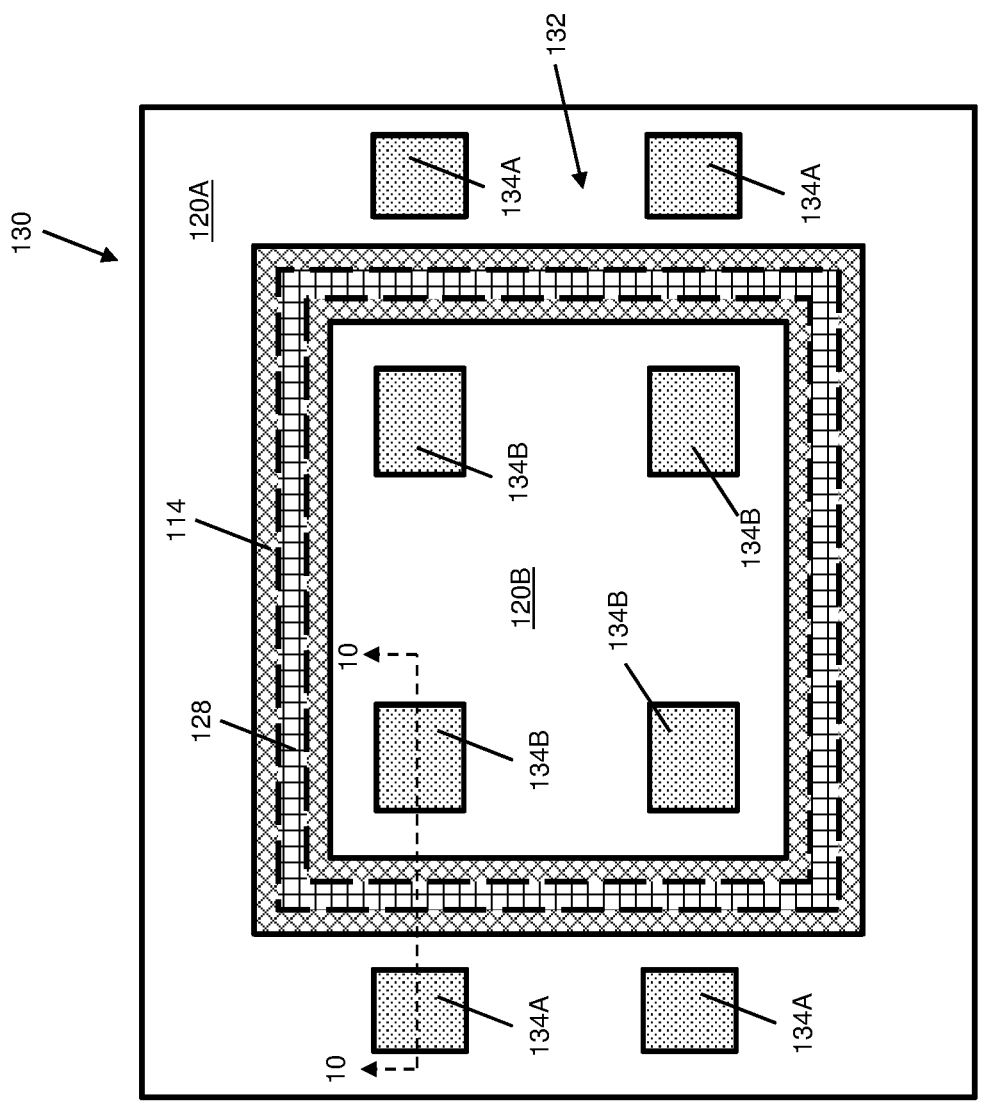
FIG. 11 shows a plan view of the IC structure according to embodiments of the disclosure.

Referring to FIGS. 10 and 11 together, further structural features of IC structure 130 are discussed according to various embodiments. FIG. 11 provides a plan view of IC structure 130, with the sight line IC structure 130 in FIG. 10 being indicated by line 10-10. Semiconductor-based isolation structure 128 of DT isolation 132 is shown in phantom in FIG. 15 to indicate that it is vertically beneath STI 114. According to an example, dielectric-based STI structure 114 and/or semiconductor-based isolation structure 128 may horizontally surround and enclose a selected active semiconductor region 120A (alternatively 120B) without enclosing the other active semiconductor region 120A, 120B. By this arrangement, deep isolation 132 may physically and electrically isolate active semiconductor region(s) 120A, 120B and device(s) 134A, 134B therein from other active semiconductor region(s), e.g., active semiconductor region 120A, 120B. In this arrangement, second active semiconductor region 120B may be horizontally distal to one sidewall of deep isolation 132 while a second, opposing sidewall of DT isolation 132 may be horizontally distal to first active semiconductor region 120A. In cases where device(s) 134A, 134B are formed on each active semiconductor region 120A, 120B, deep isolation 132 may physically and electrically isolate the device(s) 134A, 134B in each region 120A, 120B from each other. Embodiments of the disclosure may provide several technical and commercial advantages, some of which here discussed herein by way of example. As a contrast to conventional deep isolation materials, embodiments of IC structure 130 and DT isolation 132 provide a combination of distinct materials, e.g., dielectric and high-resistance polycrystalline silicon, to separate multiple active semiconductor regions 120A, 120B (e.g., highly doped wells) from each other. Conventional isolation structures, by contrast, may provide only a single region of material and/or at least a detectable concentration of dielectric materials through the deep trench isolation. Embodiments of the disclosure are, however, capable of being integrated into conventional processes to manufacture a deep trench isolation structure without incurring significant time or costs associated with forming dielectric isolation material below the depth of STI material(s). Additionally, embodiments of the disclosure allow semiconductor-based isolation structure 128 to be formed by annealing (e.g., RTA) at substantially any time during the manufacture of IC structure 130, without regard to whether the precursor material(s) for isolation structure 128 are physically blocked by other components of IC structure 130, and/or inaccessible to deposition, etching, etc. In some cases, methods according to the disclosure may allow IC structure 130 and its components to be formed in closer proximity than other IC structures 130 which rely on different processes to form DT isolation materials with other compositions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) structure, comprising:
    a semiconductor-based isolation structure on a substrate, wherein the substrate comprises a semiconductor material, wherein the semiconductor-based isolation structure comprises polycrystalline silicon, and wherein the polycrystalline silicon of the semiconductor-based isolation structure physically contacts the semiconductor material of the substrate;
    a shallow trench isolation (STI) structure on the semiconductor-based isolation structure;
    an active semiconductor region on the substrate and adjacent each of the semiconductor-based isolation structure and the STI structure, wherein the active semiconductor region includes a doped semiconductor material; and
    at least one device on the active semiconductor region and horizontally distal to the STI structure.

2. The IC structure of claim 1, wherein a bottom surface of the semiconductor-based isolation structure is located below an upper surface of the substrate.

3. The IC structure of claim 1, wherein the semiconductor-based isolation structure and the STI structure horizontally surround and enclose the active semiconductor region.

4. The IC structure of claim 1, wherein the substrate includes a high resistivity doped semiconductor material.

5. The IC structure of claim 4, wherein at least a portion of the high resistivity doped semiconductor material is below the STI structure, and horizontally between the semiconductor-based isolation structure and the active semiconductor region.

6. The IC structure of claim 1, wherein the at least one device includes a bipolar junction transistor having a silicon germanium layer on the active semiconductor region.

7. The IC structure of claim 1, wherein the STI structure is free of polycrystalline silicon.

8. An integrated circuit (IC) structure, comprising:
    a first active semiconductor region on a substrate, wherein the first active semiconductor region includes a doped semiconductor material;
    a device on the first active semiconductor region;
    a semiconductor-based isolation structure on the substrate and including a first sidewall horizontally adjacent to the first active semiconductor region, wherein the substrate comprises a semiconductor material, wherein the semiconductor-based isolation structure comprises polycrystalline silicon, and wherein the polycrystalline silicon of the semiconductor-based isolation structure physically contacts the semiconductor material of the substrate;

a shallow trench isolation (STI) structure on the semiconductor-based isolation structure and including a first sidewall horizontally abutting the first active semiconductor region; and a second active semiconductor region on the substrate and horizontally adjacent to a second sidewall of the semiconductor-based isolation structure and a second sidewall of the STI structure, wherein the silicon-based dielectric structure and the STI structure physically and electrically isolate the second active semiconductor region from the first active semiconductor region.

9. The IC structure of claim 8, wherein a bottom surface of the semiconductor-based isolation structure is located below an upper surface of the substrate.

10. The IC structure of claim 8, wherein the semiconductor-based isolation structure and the STI structure horizontally surround and enclose the first active semiconductor region.

11. The IC structure of claim 8, wherein a horizontal width of the STI structure is greater than a horizontal width of the semiconductor-based isolation structure.

12. The IC structure of claim 8, wherein the device includes a bipolar junction transistor having a silicon germanium layer, and wherein the first active semiconductor region includes a subcollector region of the bipolar junction transistor.

13. The IC structure of claim 8, wherein a vertical separation between an upper surface of the substrate and an upper surface of the STI structure is at most approximately 2.5 micrometers (μm).

14. The IC structure of claim 8, wherein the STI structure is free of polycrystalline silicon.

* * * * *